(12) United States Patent
Liu et al.

(10) Patent No.: US 10,749,499 B2
(45) Date of Patent: Aug. 18, 2020

(54) WIDEBAND FILTER INCLUDING AN ACOUSTIC RESONATOR CHIP INTEGRATED WITH 3D INDUCTORS AND A 3D TRANSFORMER

(71) Applicant: QUALCOMM Incorporated, San Diego, CA (US)

(72) Inventors: Kai Liu, San Diego, CA (US); Rui Tang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 116 days.

(21) Appl. No.: 16/115,397

(22) Filed: Aug. 28, 2018

(65) Prior Publication Data

US 2020/0076405 A1 Mar. 5, 2020

(51) Int. Cl.
| | | |
|---|---|---|
| *H03H 9/54* | (2006.01) | |
| *H03H 9/05* | (2006.01) | |
| *H03H 9/10* | (2006.01) | |
| *H03H 3/02* | (2006.01) | |
| *H03H 9/64* | (2006.01) | |
| *H03H 3/08* | (2006.01) | |
| *H01Q 1/50* | (2006.01) | |
| *H01F 27/28* | (2006.01) | |

(52) U.S. Cl.
CPC ............. *H03H 9/542* (2013.01); *H01Q 1/50* (2013.01); *H03H 3/02* (2013.01); *H03H 3/08* (2013.01); *H03H 9/059* (2013.01); *H03H 9/0523* (2013.01); *H03H 9/0542* (2013.01); *H03H 9/1007* (2013.01); *H03H 9/1064* (2013.01); *H03H 9/64* (2013.01); *H01F 27/28* (2013.01)

(58) Field of Classification Search
CPC ........... H03H 9/542; H03H 9/54; H03H 9/64; H03H 9/0542; H03H 9/1007; H03H 3/02; H03H 9/1064; H03H 3/08; H03H 9/05; H03H 9/10; H01Q 1/50
USPC ......................................................... 343/850
See application file for complete search history.

(56) References Cited

U.S. PATENT DOCUMENTS

| | | | |
|---|---|---|---|
| 6,751,470 B1* | 6/2004 | Ella ...................... | H04B 1/005 455/188.1 |
| 7,443,021 B2 | 10/2008 | Nakatani | |
| 7,492,242 B2* | 2/2009 | Carpentier ............... | H03H 3/04 333/188 |
| 9,171,797 B2 | 10/2015 | Lin et al. | |
| 9,190,340 B2 | 11/2015 | Lee et al. | |
| 10,002,700 B2* | 6/2018 | Lan ..................... | H01F 27/2804 |
| 2010/0001813 A1* | 1/2010 | Timme ................. | H03H 9/0095 333/189 |
| 2011/0241163 A1* | 10/2011 | Liu ........................ | H01L 28/40 257/531 |
| 2014/0035935 A1 | 2/2014 | Shenoy et al. | |
| 2014/0104288 A1* | 4/2014 | Shenoy ................. | H01F 41/041 345/531 |
| 2014/0240072 A1* | 8/2014 | Lan ..................... | H01F 27/2804 336/200 |
| 2017/0141756 A1* | 5/2017 | Yun ...................... | H05K 3/4602 |

(Continued)

*Primary Examiner* — Hai V Tran
(74) *Attorney, Agent, or Firm* — Seyfarth Shaw LLP (57) ABSTRACT

A wideband filter includes a passive substrate and an acoustic resonator chip on the passive substrate. The wideband filter further includes a pair of 3D inductors and a 3D transformer on the passive substrate. The pair of 3D inductors and the 3D transformer are connected to the acoustic resonator chip.

17 Claims, 10 Drawing Sheets

(56) References Cited

U.S. PATENT DOCUMENTS

2019/0081612 A1* 3/2019 Tang .................. H03H 9/542
2020/0020473 A1* 1/2020 Yun .................. H03H 9/1071

* cited by examiner

FIG. 6A — Make RDL (redistribution layer) and Cu (copper) pillars to form 3D passives on glass wafer FIG. 6B — Assembly BAW resonator chip on wafer FIG. 6C — Mold the wafer and expose the pillars FIG. 6D — Coat the molded wafer and make one RDL layer FIG. 6E — Plate solder ball or drop solder balls, complete the integrated device

WIDEBAND FILTER INCLUDING AN ACOUSTIC RESONATOR CHIP INTEGRATED WITH 3D INDUCTORS AND A 3D TRANSFORMER

BACKGROUND

Field

Aspects of the present disclosure relate to semiconductor devices and, more particularly, to a wideband filter including an acoustic resonator chip integrated with three-dimensional (3D) inductors and a 3D transformer.

Background

Mobile radio frequency (RF) chips (e.g., mobile RF transceivers) have migrated to a deep sub-micron process node due to cost and power consumption considerations. The design complexity of mobile RF transceivers is further complicated by adding circuit functions for supporting communications enhancements, such as fifth generation (5G) technologies. Further design challenges for mobile RF transceivers include analog/RF performance considerations, such as mismatch, noise, and other performance considerations. Designing these mobile RF transceivers includes using passive devices, for example, for suppressing resonance, and/or for performing filtering, bypassing, and coupling.

Successfully fabricating modern semiconductor chip products involves interplay between the materials and the processes employed. In particular, fabricating passive components for modern semiconductor chips is an increasingly challenging part of the process flow. This is particularly true in terms of maintaining a small feature size. The same challenge of maintaining a small feature size also applies to passive-on-glass (POG) technology.

SUMMARY

A wideband filter includes a passive substrate and an acoustic resonator chip on the passive substrate. The wideband filter further includes a pair of 3D inductors and a 3D transformer on the passive substrate. The pair of 3D inductors and the 3D transformer are connected to the acoustic resonator chip.

A method of fabricating a wideband filter includes forming a passive substrate including a first redistribution layer (RDL). The method also includes forming conductive pillars on a surface of the passive substrate and coupled to the first RDL. The method further includes assembling an acoustic resonator chip on the surface of the passive substrate. Each of the conductive pillars is taller than the acoustic resonator chip. The method also includes depositing a molding compound on the surface of the passive substrate. The molding compound surrounds the acoustic resonator chip and the conductive pillars. The method further includes exposing portions of the conductive pillars. The method also includes forming external interconnects coupled to the first RDL through exposed portions of the conductive pillars to form a pair of 3D inductors and a 3D transformer on the passive substrate and connected to the acoustic resonator chip.

A radio frequency (RF) front-end (RFFE) device including a wideband filter includes a passive substrate. The wideband filter also includes an acoustic resonator chip on the passive substrate. The wideband filter further includes a pair of 3D inductors and a 3D transformer on the passive substrate. The pair of 3D inductors and the 3D transformer are connected to the acoustic resonator chip. The RFFE device also includes an antenna coupled to an output of the wideband filter.

This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. Other aspects, as well as features and advantages of various aspects, will become apparent to those of skill in the art through consideration of the ensuing description, the accompanying drawings, and the appended claims.

The use of the term "and/or" is intended to represent an "inclusive OR," and the use of the term "or" is intended to represent an "exclusive OR." As described herein, the term "exemplary" used throughout this description means "serving as an example, instance, or illustration," and should not necessarily be construed as preferred or advantageous over other exemplary configurations. The term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches.

Mobile radio frequency (RF) chip designs (e.g., mobile RF transceivers) have migrated to a deep sub-micron process node due to cost and power consumption considerations. The design complexity of mobile RF transceivers is further complicated by added circuit functions for supporting communications enhancements, such as fifth generation (5G) wireless systems. Implementing 5G wireless systems increasingly involves additional passive devices and filters. Unfortunately, design rules in 5G wireless systems restrict the design of these additional passive devices and filters. For example, at higher frequencies (e.g., three GHz and above), low capacitance values are used, thereby increasing capacitor size due to serial capacitor stacking. The increased series capacitor stacking results in a larger passive-on-glass filter size.

Passive-on-glass devices include high performance inductor and capacitor components having a variety of advantages over other technologies, such as surface mount technology (SMT) or multi-layer ceramic chips. These advantages include a more compact size and smaller manufacturing variations. Passive-on-glass devices also support a higher quality (Q)-factor value that meets stringent low insertion loss and low power consumption specifications of future process nodes. Passive devices, such as inductors, may be implemented as three-dimensional (3D) structures when using passive-on-glass technologies. Three-dimensional through substrate inductors or other 3D devices, however, may experience a number of design constraints when implemented as 3D structures using passive-on-glass technology. For example, a through glass via (TGV) is used to implement high performance solenoid type inductors for 5G radio frequency applications. Unfortunately, via formation/via filling processes can cause quality issues, incur high costs, use complex process flow, and use complex supply chains. Additionally, through glass via technology has limitations on high aspect ratio/fine pitch through glass vias.

Implementing 5G wireless systems increasingly involves wideband filters. Existing passive-on-glass (POG) filters are a candidate for supporting 5G wireless systems because POG filters are used in broadband applications for filtering signals. Existing bulk acoustic wave (BAW) filters demonstrate a high quality (Q)-factor. Although existing POG and BAW filters may be implemented together in an integrated circuit (IC), they are not fabricated together on a single substrate. Rather, existing POG and BAW filters as well as surface acoustic wave (SAW) filters are implemented using a system-in-package. This is because existing POG filters are fabricated on glass, and existing BAW and SAW filters are fabricated on silicon (Si).

Planar SAW/BAW filters are implemented using a radio frequency (RF) system-in-package (SiP). Unfortunately, SAW/BAW filters are inherently configured for narrow band (e.g., <100 MHz) applications. Implementing 5G wireless systems, however, involves wideband filtering (e.g., >100 MHz bandwidth in 3.3 GHz to 5.5 GHz bands) because a process for fabricating passive devices (e.g., inductors) is not defined for BAW technology. Filters having a wide bandwidth in a passband (e.g., 200 MHz-400 MHz), and sharp attenuation (skirt) at stop bands, therefore, are desired for 5G (sub-6 GHz band) applications.

Aspects of the present disclosure co-integrate POG technology and acoustic resonator (e.g., SAW/BAW) filters with passive components to form a wideband filter having improved performance and reduced fabrication costs. The passband is greater than 200 MHz and in some case even greater than 400 MHz. Aspects of the present disclosure relate to high performance 3D passive components (e.g., 3D inductors and 3D transformer(s)) integrated with a resonator chip on a passive (e.g., glass) wafer.

Aspects of the present disclosure relate to a wideband filter that retains similar 'sharp skirt' advantages provided by BAW filters. This enables making wideband filters that current BAW technology cannot achieve in terms of high frequency (e.g. >3.3 GHz) and sharp skirt capability. This wideband filter integrates high quality (Q)-factor passives (e.g., 3D inductors, 3D transformers, etc.), and surpasses the filtering performance of other conventional LC-type filters.

In some aspects of the disclosure, the described wideband filter may be used to replace BAW filters and RF filters (e.g., LC-type and distributed filters) to implement an LC tank for an oscillator, an inductor for a power distribution network (PDN), and/or an inductor for a power management integrated circuit (PMIC). Aspects of the present disclosure improve radio frequency (RF) front-end (RFFE) module areas by enabling active devices (e.g., power amplifiers (PAs), low noise amplifiers (LNAs), and switches) and passive filters (e.g., surface acoustic wave (SAW)/bulk acoustic wave (BAW) filters, inductor-capacitor (LC) filters, distributed filters, and transformers) without involving integration through a system-in-package (SiP) configuration.

Aspects of the present disclosure may involve implementing passive components using thin films. In addition, aspects of the present disclosure leverage high performance 3D passive structures formed without a through glass via first implementation or through silicon via implementation. Consequently, the process flow is less complex. For example, formation of the 3D passive structures using a copper pillar technology and through mold vias is low in cost because there are no costs for via formation and filling, as the molding compound is deposited after pillar formation. Moreover, the form factor is small. In one configuration, the entire device is less than 5 mm×5 mm.

Figure 1:
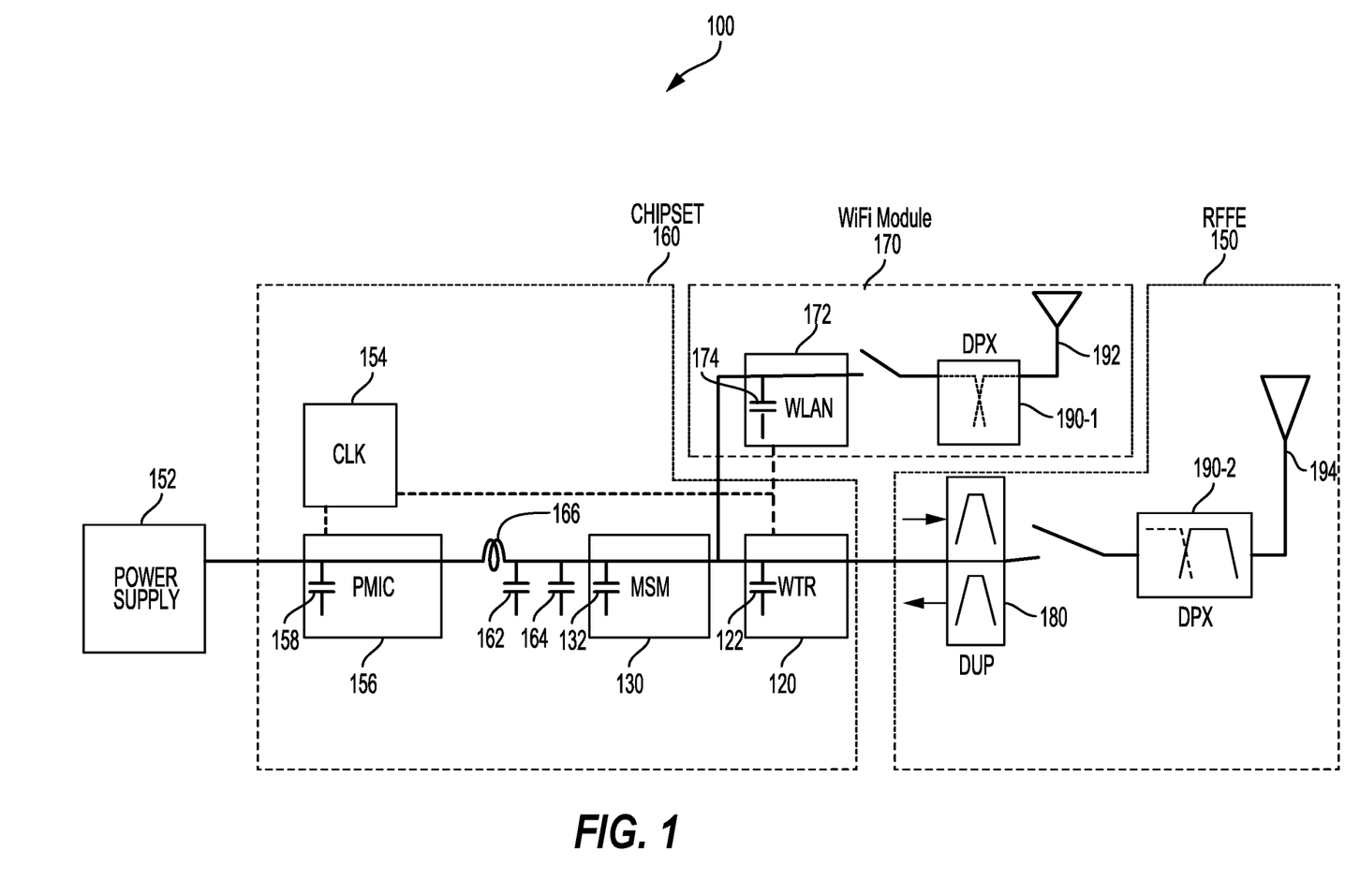
FIG. 1 is a diagram of a radio frequency (RF) communications system.

FIG. 1 is a schematic diagram of a radio frequency (RF) communications system 100 that may include a wideband filter, according to an aspect of the present disclosure. Representatively, the RF communications system 100 includes a WiFi module 170 having a first diplexer 190-1 and an RF front-end module 150 including a second diplexer 190-2 for a chipset 160 to provide wireless communications according to an aspect of the present disclosure. The WiFi module 170 includes the first diplexer 190-1 communicably coupling an antenna 192 to a wireless local area network module (e.g., WLAN module 172). The RF front-end module 150 includes the second diplexer 190-2 communicably coupling an antenna 194 to a wireless transceiver (WTR) 120 through the duplexer 180. The wireless transceiver 120 and the WLAN module 172 of the WiFi module 170 are coupled to a modem (mobile station modem (MSM), e.g., baseband modem) 130 that is powered by a power supply 152 through a power management integrated circuit (PMIC) 156.

The chipset 160 also includes capacitors 162 and 164, as well as an inductor(s) 166 to provide signal integrity. The PMIC 156, the modem 130, the wireless transceiver 120, and the WLAN module 172 each include capacitors (e.g., 158, 132, 122, and 174) and operate according to a clock 154. The geometry and arrangement of the various inductor and capacitor components in the chipset 160 may reduce the electromagnetic coupling between the components. The RF communications system 100 may also include a power amplifier (PA) integrated with the duplexer 180 (e.g., a power amplifier with integrated duplexer (PAMiD) module). The duplexer 180 may filter the input/output signals according to a variety of different parameters, including frequency, insertion loss, rejection, or other like parameters.

Figure 2:
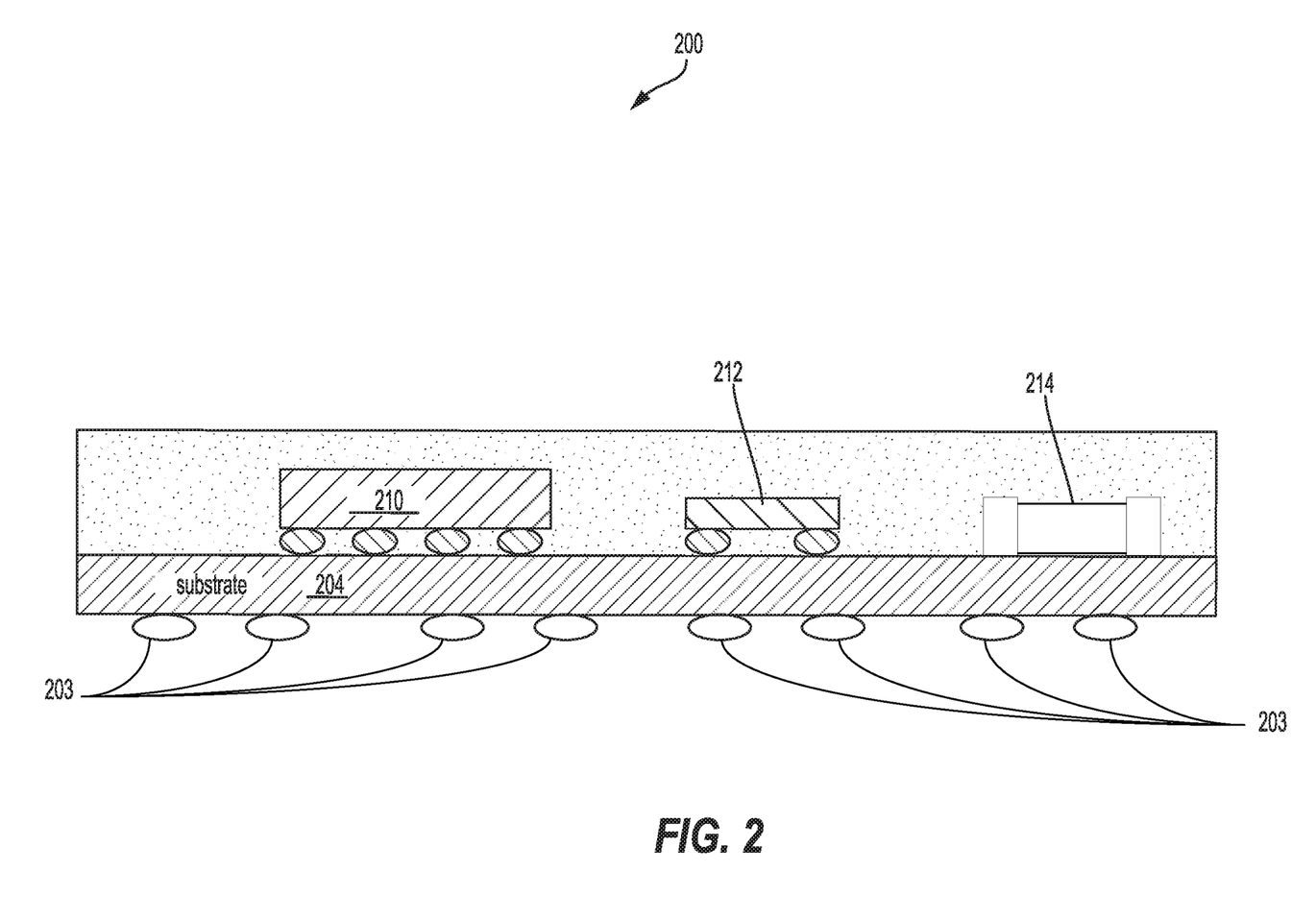
FIG. 2 illustrates a passive device module (e.g., inductor-capacitor (LC) filter).

FIG. 2 illustrates an electronic device module 200. The electronic device module 200 may include an integrated circuit module 210, a filter module 212 (e.g., inductor-capacitor (LC) filter), and a surface mount passive device module 214 (e.g., a capacitor). The filter module 212 may include a capacitor (not shown) that is coupled to an inductor (not shown). Each of the integrated circuit module 210, the filter module 212, and the surface mount passive device module 214 are coupled to a substrate 204. The substrate 204 may be coupled to a printed circuit board (not shown) via interconnects 203.

Figure 3:
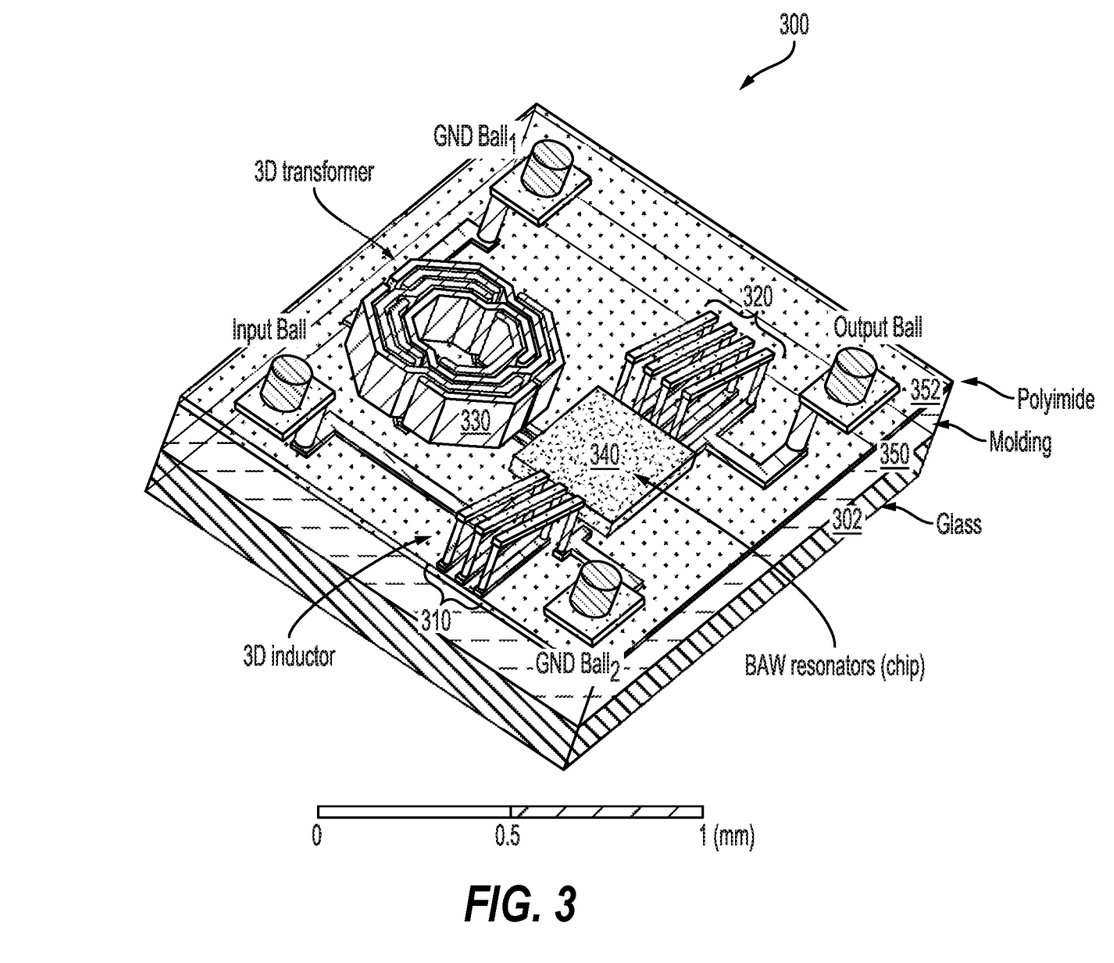
FIG. 3 is a perspective view of a layout of a wideband filter including an acoustic resonator chip integrated with three-dimensional (3D) inductors and a 3D transformer, according to an aspect of the present disclosure.

FIG. 3 is a perspective view of a layout of a wideband filter including an acoustic resonator chip integrated with three-dimensional (3D) inductors and a 3D transformer, according to an aspect of the present disclosure. In this configuration, the components of a wideband filter 300, including an acoustic resonator chip 340 integrated with 3D inductors (e.g., a first 3D inductor 310 and a second 3D inductor 320) and a 3D transformer 330, are implemented on (or in) a passive substrate 302. As described, the term "passive substrate" may refer to a substrate of a diced wafer or panel, or may refer to the substrate of a wafer/panel that is not diced. The passive substrate 302 may be comprised of glass, diamond, air, quartz, sapphire, high-resistivity silicon, or other like passive material.

Representatively, a first 3D inductor 310 (e.g., a first inductor) is arranged side-by-side with a second 3D inductor 320 (e.g., a second inductor) to form a pair of 3D inductors on a surface of the passive substrate 302. In this configuration, the acoustic resonator chip 340 is assembled on the surface of the passive substrate 302, side-by-side and between the first 3D inductor 310 and the second 3D inductor 320. The wideband filter 300 also includes the 3D transformer 330, in a side-by-side configuration and coupled to the acoustic resonator chip 340. According to aspects of the present disclosure, the pair of 3D inductors (e.g., the first 3D inductor 310 and the second 3D inductor 320) and the 3D transformer 330 may be referred to as 3D passive structures.

FIG. 3 further illustrates a molding layer 350 on the surface of the passive substrate 302. In this configuration, the pair of 3D inductors (e.g., the first 3D inductor 310 and the second 3D inductor 320) may be formed using through mold vias, coupling conductive traces on opposing surfaces of the molding layer 350. The molding layer 350 is covered with a passivation layer 352 (e.g., polyimide) and a redistribution layer to couple input/output (IO) (e.g., input components) and ground (GND) interconnections (e.g., Input Ball, Output Ball, GND Ball$_1$, GND Ball$_2$). Additional features of the wideband filter 300 are illustrated in FIGS. 4A-4C.

Figure 4A:
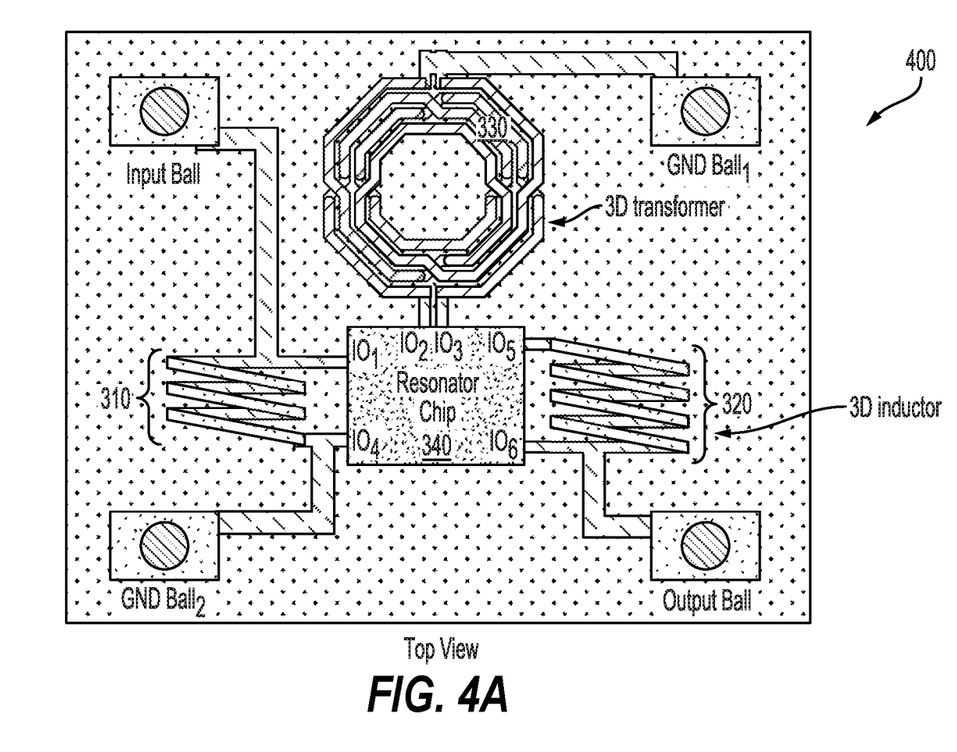
FIGS. 4A-4C illustrate a top view and side views of the wideband filter of FIG. 3, according to aspects of the present disclosure.
Figures 4B, 4C:
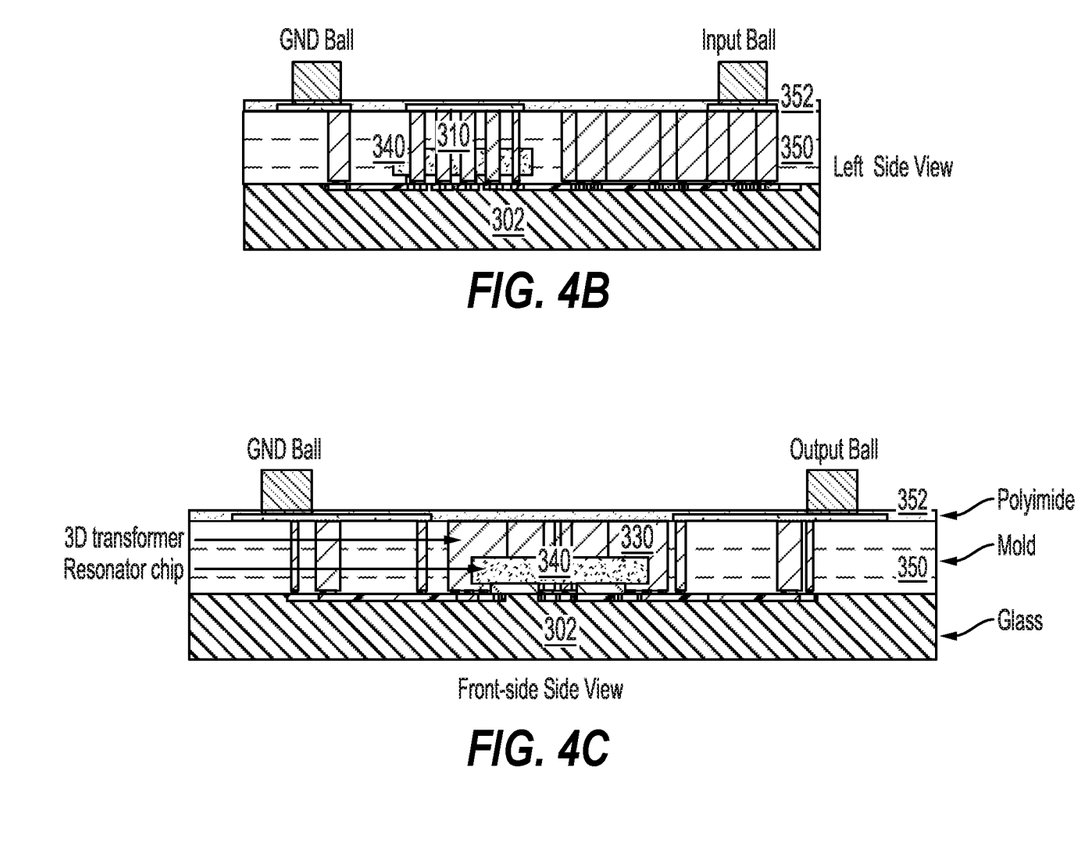

FIGS. 4A-4C illustrate a top view 400 and side views of the wideband filter 300 of FIG. 3, according to aspects of the present disclosure. As shown in FIG. 4A, the top view of the wideband filter 300 illustrates the acoustic resonator chip 340, including six (6) input/output (IO) pins. In this configuration, the Input Ball is coupled to an input of the first 3D inductor 310 and an input IO$_1$ of the acoustic resonator chip 340. In addition, a first ground component (e.g., GND Ball$_1$) is coupled to short a pair of outputs of the 3D transformer 330. A second ground component (e.g., GND Ball$_2$) is coupled to a pin (IO$_4$) of the acoustic resonator chip 340 and an output of the first 3D inductor 310. A second 3D inductor 320 is coupled between IO pins (e.g., IO$_5$ and IO$_6$) of the acoustic resonator chip 340. An output component (e.g., Output Ball) is coupled to an output (e.g., IO$_6$) of the acoustic resonator chip 340 and an output of a second 3D inductor 320.

FIG. 4B illustrates a left hand-side view of the wideband filter 300 of FIG. 3, according to aspects of the present disclosure. FIG. 4C illustrates a front-side view of the wideband filter 300 of FIG. 3, according to aspects of the present disclosure. FIGS. 4B and 4C further illustrate the molding layer 350 conductive pillars of the 3D passive structures (e.g., the first 3D inductor 310, the second 3D inductor 3D, and/or the 3D transformer 330) of the wideband filter 300. The acoustic resonator chip 340 may be a bulk acoustic wave (BAW) resonator or a surface acoustic wave (SAW) resonator.

Figure 5A:
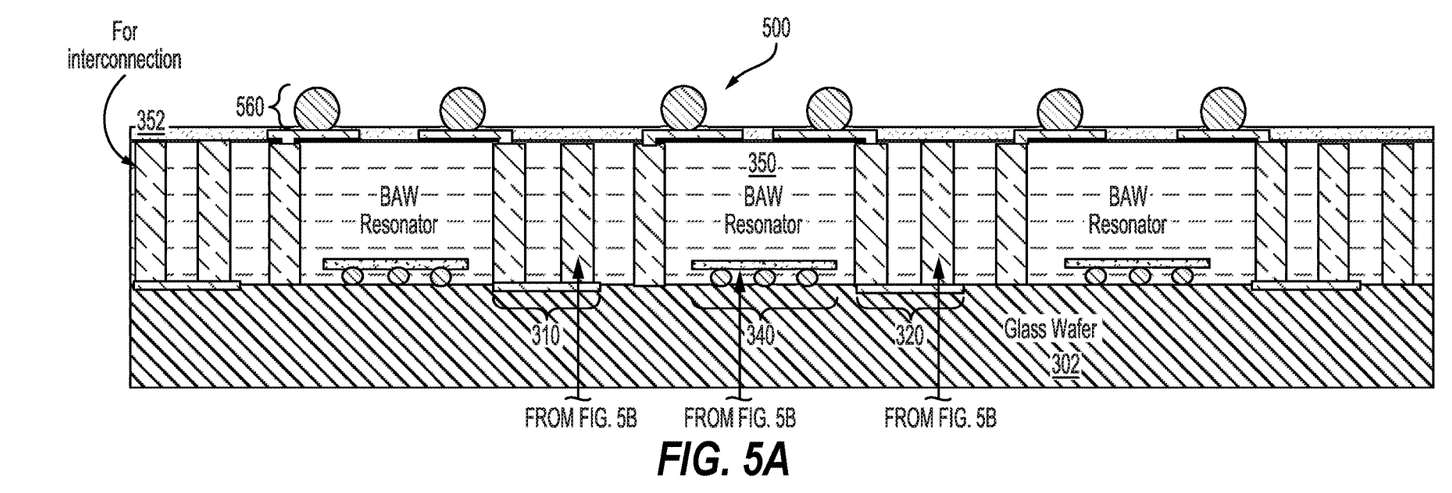
FIGS. 5A and 5B illustrate a side view and a perspective view, respectively, of the wideband filter of FIG. 3, according to aspects of the present disclosure.
Figure 5B:
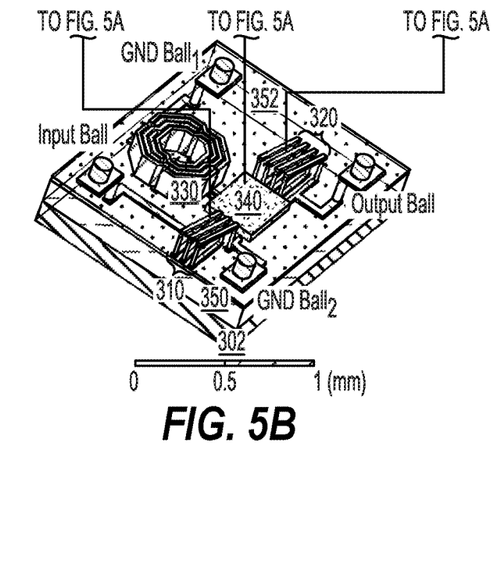

FIG. 5A illustrates a side view 500 of a perspective view shown in FIG. 5B of the wideband filter 300 of FIG. 3, according to aspects of the present disclosure. As shown in FIG. 5A, the side view 500 of the wideband filter 300 illustrates the acoustic resonator chip 340 (e.g., BAW resonator) between the first 3D inductor 310 and the second 3D inductor 320. In this configuration, the Input Ball, the first ground component (e.g., GND Ball$_1$), the second ground component (e.g., GND Ball$_2$), and the Output Ball may be implemented using plated or dropped solder balls to form the solder balls 560. For example, the solder balls 560 may be coupled to a redistribution layer and the passivation layer 352, as further described in FIGS. 6A-6F.

Figure 6A:
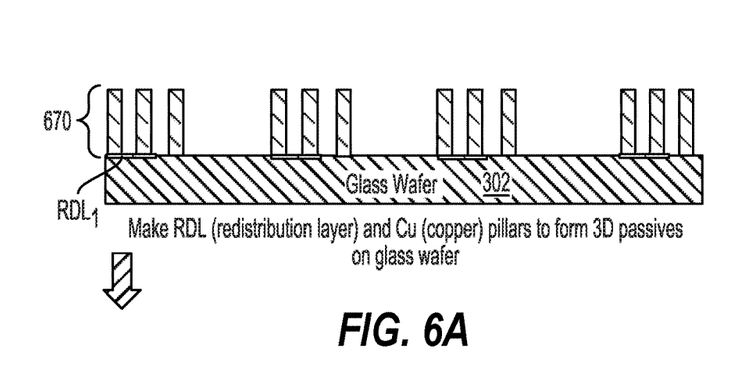
FIGS. 6A-6F illustrate side views of a process for fabricating the wideband filter of FIG. 3, using conductive pillar technology, according to aspects of the present disclosure.

FIGS. 6A-6F illustrate side views of a process 600 for fabricating the wideband filter 300 of FIG. 3, using conductive pillar technology, according to aspects of the present disclosure. As shown in FIG. 6A, the side view for fabricating the wideband filter 300 begins with formation of a three-dimensional (3D) passive structure using conductive pillar technology. The 3D passive structure is integrated with the acoustic resonator chip 340 on a passive substrate 302 (e.g., glass wafer).

As shown in FIG. 6A, forming the 3D passive structure includes forming a first redistribution layer RDL$_1$ and conductive pillars 670 on a surface of the passive substrate 302. The first redistribution layer RDL$_1$ is within the passive substrate 302 and may include conductive interconnects or metallization arranged to couple the conductive pillars 670 to form 3D passive structures. In some aspects, conductive traces couple the conductive pillars 670 on opposing surfaces of the molding layer 350 to enable formation of 3D passive structures on the surface of the passive substrate 302. The passive substrate 302, therefore, does not include through substrate vias for interconnecting the 3D passive structures. Rather, the 3D passive structures are formed by interconnecting the conductive pillars 670 on the surface of the passive substrate 302 and a surface of the molding layer 350.

Figure 6B:
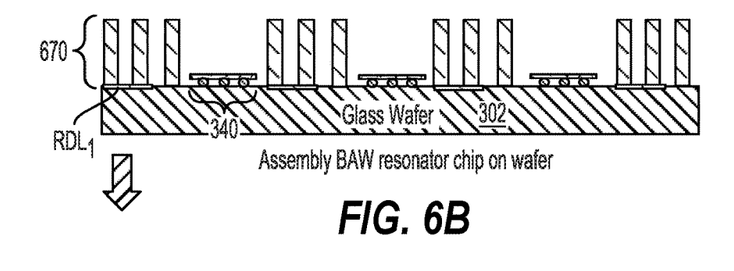

As shown in FIG. 6B, the acoustic resonator chip 340 is assembled on the surface of the passive substrate 302, between the conductive pillars 670. In this example, several of the acoustic resonator chips (e.g., 340) are shown on a glass wafer (e.g., passive substrate 302) prior to dicing to form the wideband filter 300 of FIG. 3. In FIGS. 6A-6F, the terms "wafer" and "substrate" are interchanged to describe formation of the wideband filter 300 of FIG. 3.

Figure 6C:
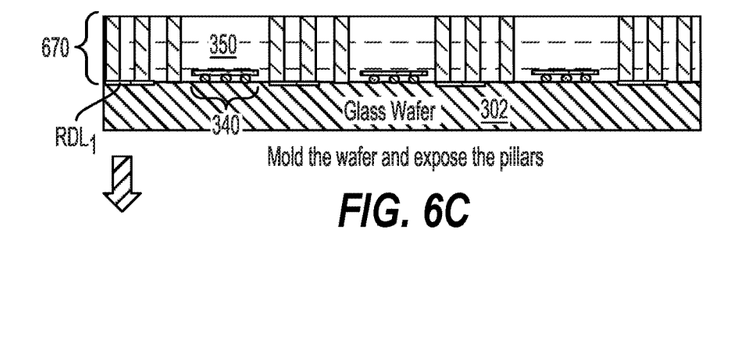

In FIG. 6C, a molding layer 350 is deposited on the surface of the passive substrate 302, the acoustic resonator chip 340, and the conductive pillars 670. The molding layer 350 may be an epoxy molding compound or capillary underfill material. The molding layer 350 substantially surrounds the conductive pillars 670 and the acoustic resonator chip 340. The conductive pillars 670, therefore, become through mold vias after depositing a molding compound to form the molding layer 350. Once deposited, the molding layer 350 is etched to expose the conductive pillars 670 to complete formation of the conductive pillars 670 as through mold vias.

Figure 6D:
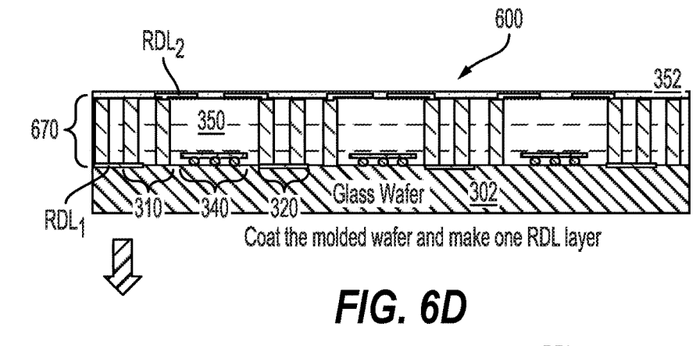

In FIG. 6D, portions of the molding layer 350 are coated with a passivation layer 352. In addition, conductive interconnects may be deposited to electrically contact exposed portions of the conductive pillars 670 to form a second redistribution layer $RDL_2$. In certain aspects of the present disclosure, the first distribution layer $RDL_1$ and the second redistribution layer $RDL_2$ collectively form a single redistribution layer. In this example, conductive traces (not shown) are also deposited on the molding layer 350 to form 3D passive structures, such as the first 3D inductor 310 and the second 3D inductor 320 as well as the 3D transformer 330, shown in FIG. 3.

Figure 6E:
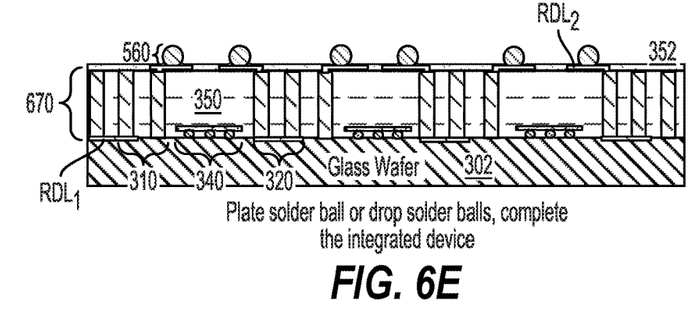
Figure 6F:
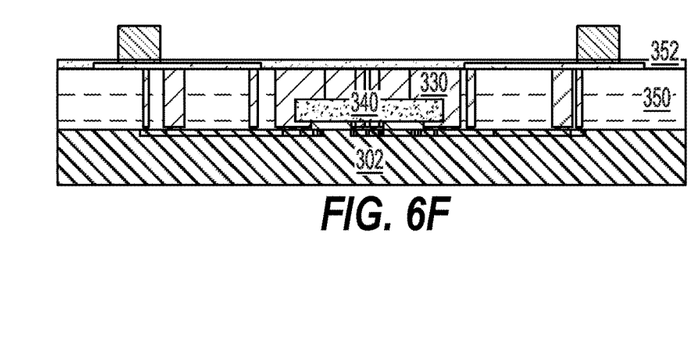

In FIG. 6E, multiple external interconnects (e.g., solder balls 560) may be plated or dropped on the molding layer 350 and coupled to one or more of the conductive pillars 670 through the second redistribution layer $RDL_2$. The solder balls 560 may form ball grid arrays (BGAs), land grid arrays (LGAs), and the like to complete formation of the wideband filter 300, as shown in FIG. 6F. In this configuration, the first 3D inductor 310 and the second 3D inductor 320 are formed using the conductive pillar technology (e.g., copper pillar technology) instead of through glass via technology. In addition, the 3D transformer 330 is a transformer formed from a spiral configuration. In one aspect, the 3D transformer 330 is realized as two spiral coupled inductors that are formed (e.g., electroplated) on the passive substrate 302 at a height that is shorter than a height of the conductive pillars 670.

In one aspect, the 3D passive structures (e.g., 310, 320, 330) may be coupled to the acoustic resonator chip 340 via the first redistribution layer $RDL_1$. The 3D passive structures are coupled to the solder balls through the second redistribution layer $RDL_2$ (e.g., a second RDL). The 3D passive structures are subsequently coupled to external devices such as mixers and amplifiers through the redistribution layer $RDL_2$ and the solder balls 560. Although described with a particular number of inductors and transformers, the present disclosure is not limited to this particular combination. For example, four inductors and two transformers can be provided.

The present disclosure has applicability for a wide range of products. For example, concepts described in the disclosure can be employed in RF filters (LC type and distributed), LC tanks (such as for oscillators), inductors for power delivery networks, inductors for power management ICs (PMICs), as well as other products.

Figure 7:
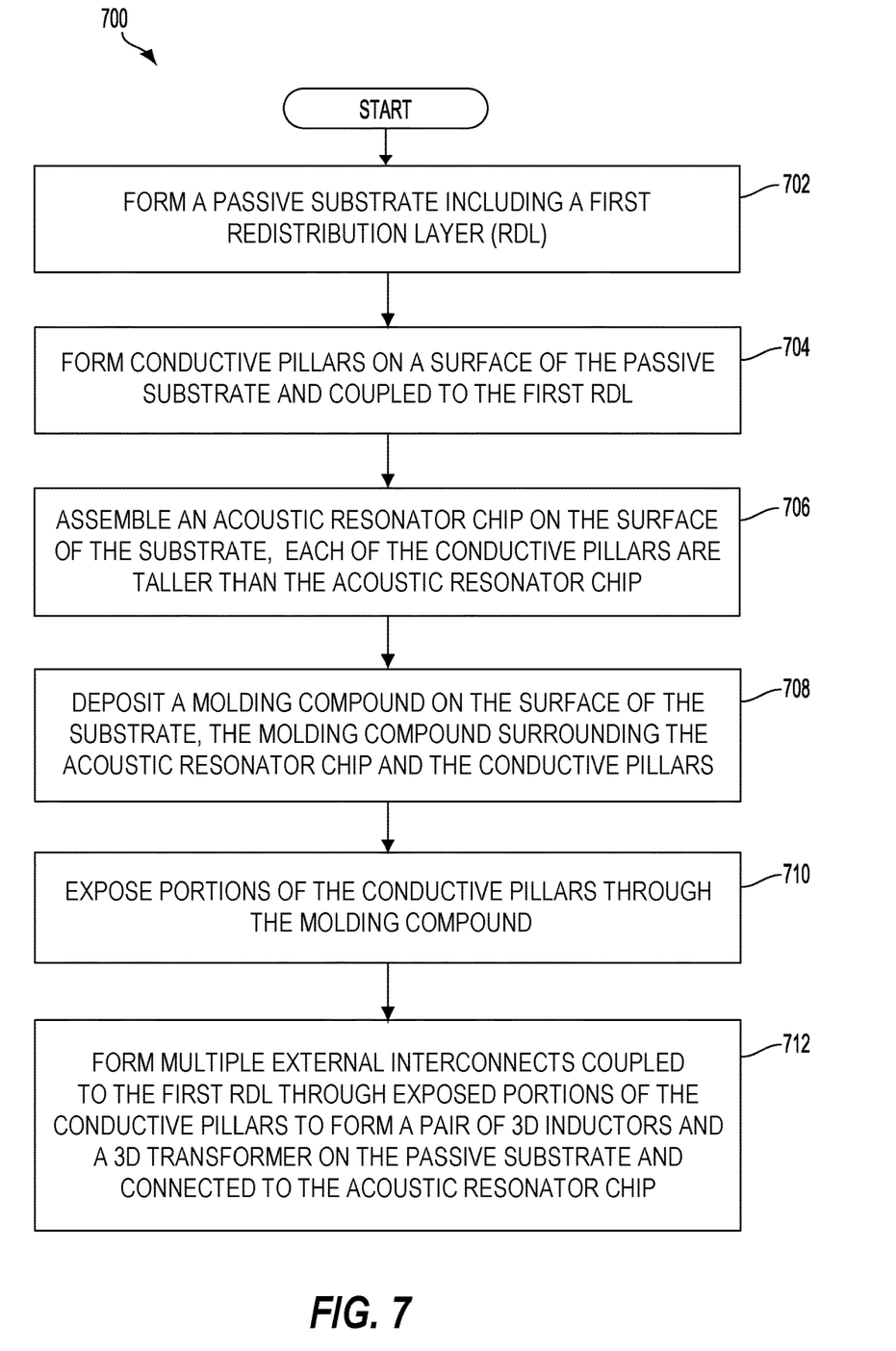
FIG. 7 is a flow diagram illustrating a method of fabricating a wideband filter, according to aspects of the present disclosure.

FIG. 7 is a flow diagram illustrating a method 700 of fabricating a wideband filter, according to aspects of the present disclosure. At block 702, a passive substrate including a first redistribution layer (RDL) is formed. For example, as shown in FIG. 6A, the first redistribution layer $RDL_1$ is formed on a surface of a passive substrate 302 (e.g., a glass wafer). At block 704, conductive pillars are formed on the surface of the passive substrate. For example, as shown in FIG. 6A, conductive pillars 670 (e.g. copper (Cu)) are formed on the surface of the passive substrate 302.

At block 706, an acoustic resonator chip is assembled on the surface of the passive substrate. According to aspects of the present disclosure, each of the conductive pillars is taller than the acoustic resonator chip. For example, as shown in FIG. 6B, an acoustic resonator chip 340 is assembled on the surface of the passive substrate 302. Each of the conductive pillars 670 is taller than the acoustic resonator chip 340. At block 708, a molding compound is deposited on the surface of the substrate. The molding compound surrounds the acoustic resonator chip and the conductive pillars. For example, as shown in FIG. 6C, a molding compound (e.g., molding layer 350) is deposited on the surface of the passive substrate 302, the conductive pillars 670, and the acoustic resonator chip 340.

Referring again to FIG. 7, at block 710, portions of the conductive pillars are exposed through the molding compound. Exposing portions of the conductive pillars enables conductive traces to couple to the exposed portions of the conductive pillars to form 3D passive structures. For example, as shown in FIG. 6C, the molding layer 350 is etched to expose the conductive pillars 670 to complete formation of the conductive pillars 670 as through mold vias.

At block 712, multiple external interconnects are formed to couple to the first RDL through exposed portions of the conductive pillars to form a pair of 3D inductors and a 3D transformer on the passive substrate and connected to the acoustic resonator chip. For example, as shown in FIG. 6D, a second redistribution layer $RDL_2$ is formed to couple to the first redistribution layer $RDL_1$ through the conductive pillars 670. In this configuration, interconnection of the conductive pillars 670 through the second redistribution layer $RDL_2$ enables formation of the first 3D inductor 310 and the second 3D inductor 320 to form the pair of 3D inductors. This interconnect of the conductive pillars 670 enables formation of the 3D transformer 330. As shown in FIG. 4A, the 3D transformer 330, the first 3D inductor 310, and the second 3D inductor 320 are coupled to input/output (IO) ports of the acoustic resonator chip 340.

Figure 8:
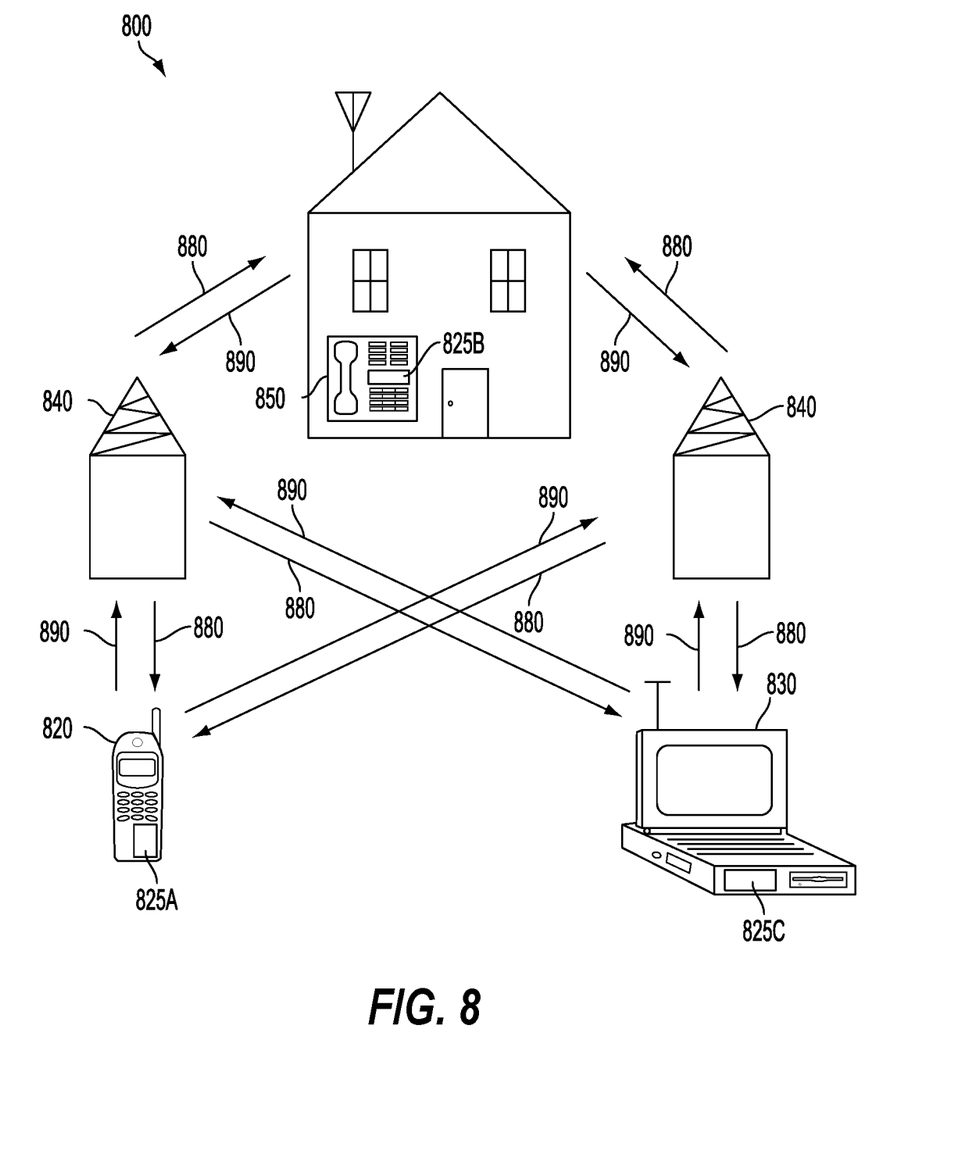
FIG. 8 is a block diagram showing an exemplary wireless communications system in which a configuration of the present disclosure may be advantageously employed.

FIG. 8 is a block diagram showing an exemplary wireless communications system 800 in which an aspect of the present disclosure may be advantageously employed. For purposes of illustration, FIG. 8 shows three of the remote units 820, 830, and 850 and two of the base stations 840. It will be recognized that wireless communications systems may have many more remote units and base stations. Remote units 820, 830, and 850 each include IC devices 825A, 825C, and 825B that include the disclosed wideband filter. It will be recognized that other devices may also include the disclosed wideband filter, such as the base stations, switching devices, and network equipment including a RF front-end module. FIG. 8 shows forward link signals 880 from one of the base stations 840 to the remote units 820, 830, and 850 and reverse link signals 890 from the remote units 820, 830, and 850 to base stations 840.

In FIG. 8, one of the remote units 820 is shown as a mobile telephone, one of the remote units 830 is shown as a portable computer, and remote unit 850 is shown as a fixed location remote unit in a wireless local loop system. For example, the remote units 820, 830, and 850 may be a mobile phone, a hand-held personal communications systems (PCS) unit, a portable data unit such as a personal digital assistant (PDA), a GPS enabled device, a navigation device, a set top box, a music player, a video player, an entertainment unit, a fixed location data unit such as meter reading equipment, or a communications device, including an RF front-end module, that stores or retrieves data or computer instructions, or combinations thereof. Although FIG. 8 illustrates remote units according to the aspects of the present disclosure, the present disclosure is not limited to these exemplary illustrated units. Aspects of the present disclosure may be suitably employed in many devices, which include the disclosed wideband filter.

Figure 9:
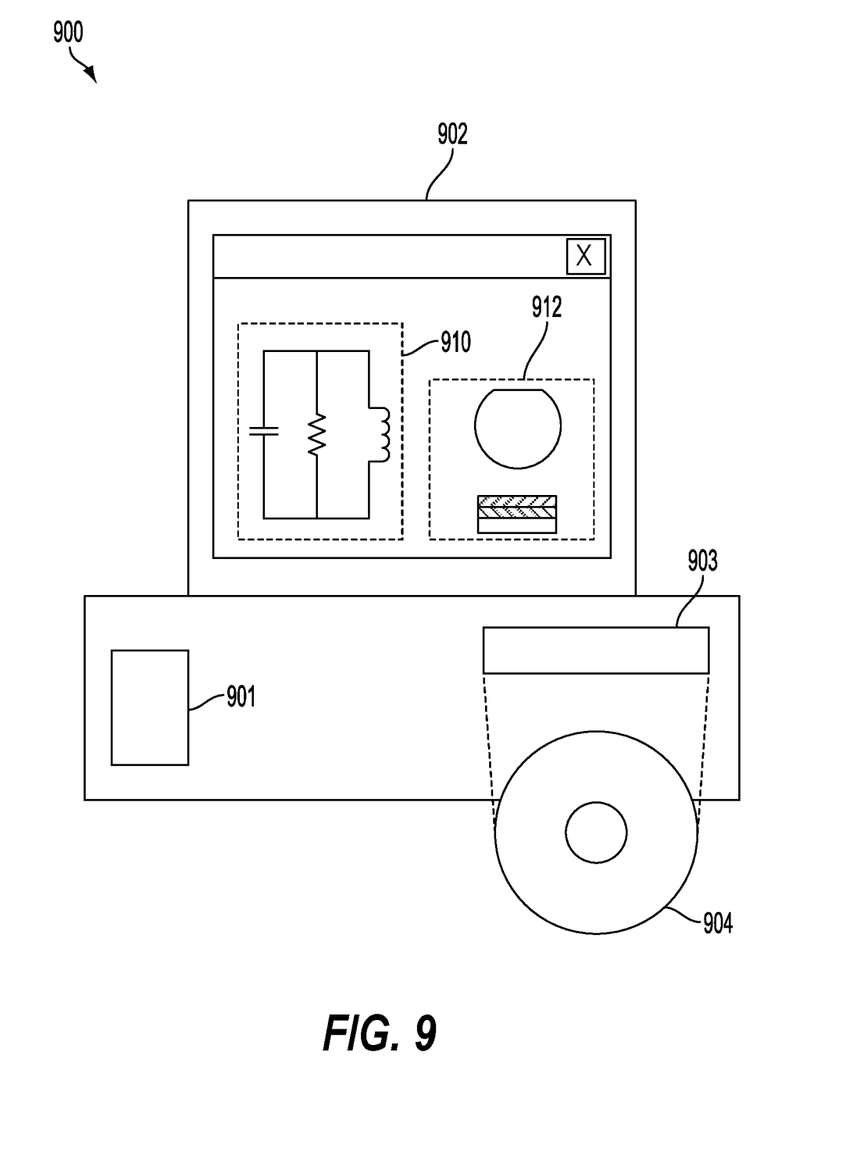
FIG. 9 is a block diagram illustrating a design workstation used for circuit, layout, and logic design of a three-dimensional passive structure, according to aspects of the present disclosure.

FIG. 9 is a block diagram illustrating a design workstation used for circuit, layout, and logic design of the wideband filter disclosed above. A design workstation 900 includes a hard disk 901 containing operating system software, support files, and design software such as Cadence or OrCAD. The design workstation 900 also includes a display 902 to facilitate design of a circuit 910 or an IC device 912 including the wideband filter. A storage medium 904 is provided for tangibly storing the design of the circuit 910 or IC device 912 including the wideband filter. The design of the circuit 910 or the IC device 912 including the wideband filter may be stored on the storage medium 904 in a file format such as GDSII or GERBER. The storage medium 904 may be a CD-ROM, DVD, hard disk, flash memory, or other appropriate device. Furthermore, the design workstation 900 includes a drive apparatus 903 for accepting input from or writing output to the storage medium 904.

Data recorded on the storage medium 904 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 904 facilitates the design of the circuit 910 or the three-dimensional passive structure by decreasing the number of processes for designing semiconductor or passive wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a non-transitory computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, include compact disc (CD), laser disc, optical disc, digital versatile disc (DVD) and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communications apparatus. For example, a communications apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the present disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the present disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the present disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communications media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. In addition, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), and Blu-ray disc where disks usually reproduce data magnetically, while discs reproduce data optically with lasers. Combinations of the above should also be included within the scope of computer-readable media.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more."

Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b, and c. All structural and functional equivalents to the elements of the various aspects described throughout this present disclosure that are known or later come to be known to those of ordinary skill in the art are expressly incorporated herein by reference and are intended to be encompassed by the claims. Moreover, nothing disclosed herein is intended to be dedicated to the public regardless of whether such present disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "a step for."

What is claimed is:

1. A wideband filter, comprising:
    a passive substrate;
    a molding compound on the passive substrate;
    an acoustic resonator chip on the passive substrate; and
    a pair of 3D inductors and a 3D transformer on the passive substrate and connected to the acoustic resonator chip, the pair of 3D inductors comprising through mold vias on a surface of the passive substrate and extending to a surface of the molding compound, and the pair of 3D inductors are side-by-side with the acoustic resonator chip between the pair of 3D inductors, each on the surface of the passive substrate.

2. The wideband filter of claim 1, further comprising a first ground component coupled to short a pair of outputs of the 3D transformer.

3. The wideband filter of claim 2, further comprising a second ground component coupled to an output of the acoustic resonator chip and an output of a first inductor of the pair of 3D inductors.

4. The wideband filter of claim 3, further comprising an input component coupled to an input of the acoustic resonator chip and an input of the first inductor of the pair of 3D inductors.

5. The wideband filter of claim 3, further comprising an output component coupled to the output of the acoustic resonator chip and an output of a second inductor of the pair of 3D inductors.

6. The wideband filter of claim 1, in which the acoustic resonator chip is a bulk acoustic wave (BAW) resonator or a surface acoustic wave (SAW) resonator.

7. The wideband filter of claim 1, in which the passive substrate comprises glass or diamond.

8. The wideband filter of claim 1, in which a passband of the wideband filter is greater than 200 MHz.

9. A method of fabricating a wideband filter, the method comprising:
    forming a passive substrate including a first redistribution layer (RDL);
    forming conductive pillars on a surface of the passive substrate and coupled to the first RDL;
    assembling an acoustic resonator chip on the surface of the passive substrate, in which each of the conductive pillars is taller than the acoustic resonator chip;
    depositing a molding compound on the surface of the passive substrate, the molding compound surrounding the acoustic resonator chip and the conductive pillars;

exposing portions of the conductive pillars; and forming a plurality of external interconnects coupled to the first RDL through the exposed portions of the conductive pillars to form a pair of 3D inductors and a 3D transformer on the passive substrate and connected to the acoustic resonator chip, the pair of 3D inductors comprising through mold vias on a surface of the passive substrate and extending to a surface of the molding compound, and the pair of 3D inductors are side-by-side with the acoustic resonator chip between the pair of 3D inductors, each on the surface of the passive substrate.

10. The method of claim 9, further comprising forming a second RDL having a passivation layer, the second RDL between the molding compound and the plurality of the external interconnects and coupling the conductive pillars to the plurality of the external interconnects.

11. The method of claim 9, in which forming the plurality of the external interconnects comprises forming a three-dimensional (3D) solenoidal inductor.

12. A radio frequency (RF) front-end (RFFE) device, comprising:
a wideband filter including a passive substrate, a molding compound on the passive substrate, an acoustic resonator chip on the passive substrate, and a pair of 3D inductors and a 3D transformer on the passive substrate and connected to the acoustic resonator chip, the pair of 3D inductors comprising through mold vias on a surface of the passive substrate and extending to a surface of the molding compound, and the pair of 3D inductors are side-by-side with the acoustic resonator chip between the pair of 3D inductors, each on the surface of the passive substrate; and
an antenna coupled to an output of the wideband filter.

13. The RFFE device of claim 12, further comprising:
a first ground component coupled to short a pair of outputs of the 3D transformer; and
a second ground component coupled to an output of the acoustic resonator chip and an output of a first inductor of the pair of 3D inductors.

14. The RFFE device of claim 13, further comprising an input component coupled to an input of the acoustic resonator chip and an input of the first inductor of the pair of 3D inductors.

15. The RFFE device of claim 13, further comprising an output component coupled to the output of the acoustic resonator chip and an output of a second inductor of the pair of 3D inductors.

16. The RFFE device of claim 12, in which the acoustic resonator chip is a bulk acoustic wave (BAW) resonator or a surface acoustic wave (SAW) resonator.

17. The RFFE device of claim 12, in which a passband of the wideband filter is greater than 200 MHz.

* * * * *